United States Patent
Weyh et al.

(10) Patent No.: US 8,384,408 B2
(45) Date of Patent: Feb. 26, 2013

(54) TEST MODULE WITH BLOCKS OF UNIVERSAL AND SPECIFIC RESOURCES

(75) Inventors: Andree Weyh, Tuebingen (DE); Rolf Neuweiler, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 139 days.

(21) Appl. No.: 12/376,429

(22) PCT Filed: Aug. 4, 2006

(86) PCT No.: PCT/EP2006/065080
§ 371 (c)(1),
(2), (4) Date: Apr. 24, 2009

(87) PCT Pub. No.: WO2008/014827
PCT Pub. Date: Feb. 7, 2008

(65) Prior Publication Data
US 2010/0164527 A1    Jul. 1, 2010

(51) Int. Cl.
*G01R 31/02* (2006.01)
(52) U.S. Cl. .................................. 324/762.01
(58) Field of Classification Search ........................ None
See application file for complete search history.

(56) References Cited

U.S. PATENT DOCUMENTS

| | | | | |
|---|---|---|---|---|
| 6,275,962 | B1 * | 8/2001 | Fuller et al. | 324/527 |
| 6,314,034 | B1 * | 11/2001 | Sugamori | 702/118 |
| 7,080,357 | B2 * | 7/2006 | Foster et al. | 717/126 |
| 7,210,087 | B2 * | 4/2007 | Mukai et al. | 714/742 |
| 7,640,471 | B2 * | 12/2009 | Miao et al. | 714/724 |
| 2005/0261856 | A1 * | 11/2005 | Kushnick et al. | 702/117 |

FOREIGN PATENT DOCUMENTS

WO   WO 2005/114236 A1   12/2005
WO   WO 2008/014827      2/2008

* cited by examiner

Primary Examiner — Jermele M Hollington
(74) Attorney, Agent, or Firm — Holland & Hart LLP

(57) ABSTRACT

A test module for a test apparatus for testing a device under test, the test module being adapted for performing a specific test function and having a universal section adapted to provide test resources being unspecific with regard to the test function of the test module, the universal section having a control interface adapted to be connected to a central control device of the test apparatus, and having a specific section to be coupled to the universal section and adapted to provide test resources being specific with regard to the test function of the test module, the specific section having a device under test interface adapted to be connected to the device under test.

20 Claims, 2 Drawing Sheets

TEST MODULE WITH BLOCKS OF UNIVERSAL AND SPECIFIC RESOURCES

The present invention relates to tests of devices under test using a test device. This application is a 371 of PCT/EP2006/065080 filed on Aug. 4, 2006.

BACKGROUND OF THE INVENTION

For testing electronic devices, in particular integrated electronic circuits providing electrical input and output signals (for instance digital inputs or outputs, analog inputs or outputs, RF inputs or outputs, static/DC inputs or outputs), a test or stimulus signal is fed to an input of the device under test, and a response signal of the device under test is evaluated by an automatic test equipment, for example by comparison with expected data. Such an automatic test equipment has included a particular test functionality, that it to say test functions or routines which the test equipment may carry out. This test functionality may be incorporated in the test equipment in the form of executable software code.

An example for an available test device is the 93000 test device of Agilent Technologies.

Conventionally, a test device may be connected between a workstation and one or more devices under test (DUT). The test device is formed by a number of test modules connected in parallel to one another and specifying a particular test to be performed. Each of the modules has specific resources allowing to fulfill a specific partial function of a complex test routine. For instance, a digital waveform module may have the capability to provide a digital waveform signal that may be used during a test. An analog waveform module may have the capability to provide an analog waveform signal that may be used during the test. Each of the modules has to be developed individually in accordance with its specific function during the test. This may involve significant development costs.

SUMMARY

According to an embodiment, a test apparatus may have: a plurality of test channels for testing a device under test, each test channel including a test module being adapted for performing a specific test function and including a universal section adapted to provide test resources being unspecific with regard to the test function of the test module, the universal section including a control interface adapted to be connected to a central control device of the test apparatus; a specific section coupled to the universal section and adapted to provide test resources being specific with regard to the test function of the test module, the specific section including a device under test interface adapted to be connected to the device under test.

According to an exemplary embodiment of the present invention, a test module for a test apparatus for testing a device under test is provided, the test module being adapted for performing a specific test function (for instance a partial function in the context of a complex test) and comprising a universal section (for instance a hardware and/or software block being independent of the partial function) adapted to provide test resources (for instance memory resources and/or processing resources) being unspecific with regard to the test function of the test module, the universal section comprising a control interface adapted to be connected to a central control device of the test apparatus, and a specific section (for instance a hardware and/or software block being adjusted selectively to fulfill the partial function) to be coupled (for instance via a module internal interface) to the universal section and adapted to provide test resources being specific with regard to the test function of the test module, the specific section comprising a device under test interface adapted to be connected to the device under test (that is to say to one or more devices under test).

According to another exemplary embodiment, a test device for a test apparatus (for instance similar to the 93000 test device of Agilent Technologies) for testing a device under test is provided, the test device comprising a receiving unit (for instance a rack including multiple slots for cartridge-like test modules) adapted for receiving a plurality of test modules, and a plurality of test modules having the above mentioned features to be received (or received) in the receiving unit.

According to another exemplary embodiment, a test apparatus for testing a device under test is provided, the test apparatus comprising a central control device (for instance a computer like a workstation or a laptop or a PC) for centrally controlling (and/or monitoring) a test to be performed for testing the device under test, and a test device having the above mentioned features, wherein the control interface of the plurality of test modules to be received in the receiving unit of the test device are connected (or connectable) to the central control device.

According to still another exemplary embodiment, a method of configuring (for instance for programming or installing) a test device for a test apparatus for testing a device under test is provided, the method comprising inserting a plurality of test modules having the above mentioned features in a receiving unit of the test device, and at least partially configuring (that is to say configuring the respective test modules in accordance with a specific test routine to be carried out) at least two of the universal sections of the plurality of test modules simultaneously (that is to say at the same time, for instance by supplying identical programming signals or configuring instructions to each of the at least two of the universal sections) in accordance with a specific test (for instance test "XYZ" for testing DUT "ABC") for testing the device under test.

Embodiments of the invention can be partly or entirely embodied or supported by one or more suitable software programs, which can be stored on or otherwise provided by any kind of data carrier, and which might be executed in or by any suitable data processing unit. Software programs or routines can be advantageously applied for providing a test function (for instance generating stimulus signals for stimulating a device under test, and/or evaluating response signals of the device under test in response to the application of the stimulus signals) for testing a device under test to be performed by a test device. The test routine execution according to an embodiment of the invention can be performed by a computer program, i.e. by software, or by using one or more special electronic optimization circuits, i.e. in hardware, or in hybrid form, i.e. using software components and hardware components.

According to an exemplary embodiment, a test module or test cartridge may be provided comprising a universal section which is not restricted or individualized to specific test functions to be carried out by the test module, and a specific section which is specifically adjusted or individualized to a particular test function of the test module in the context of a more complex entire test procedure. In contrast to conventional systems, in which test modules have been entirely specified to be in accordance with a specific test function, the test module according to the described exemplary embodiment comprises a significant part of standard electronic equipment which is not at all individualized with respect to the specific test function. For instance, processing resources and storage resources may be accommodated in this general or multi-purpose portion, whereas the specific characteristics and specific hardware and software modules which are individualized to be adjusted to a specific test function may be provided in an additional specific section. Therefore, only the specific section has to be designed or developed individually when a new test module is created or planned, whereas the universal section may be provided identical for all different kinds of test modules. Universal section and specific section may be coupled via a module internal interface which may connect and electronically translate between the two sections.

By providing such a common "universal channel" component in all channels of a test system, a defined interface may be provided for coupling to a workstation or any other central control instance to a channel specific driver/receiver which may, in turn, be coupled to the device under test (DUT). Such an interface may be provided with respect to a mechanical, an electrical, a volume and/or a software coupling. Consequently, exemplary embodiments may reduce the effort for developing new test modules, may shorten development times, may reduce the development costs, may reduce the costs per module because of higher numbers of components (particularly of universal sections), and may reduce production costs due to a smaller number of variants.

In the context of such a test apparatus, a workstation as a central control entity supplies an actual test device with a plurality of control signals. The test device may be a rack including a plurality of slots, wherein different test modules may be inserted in a modular manner by a user inside the slots so as to define a specific test architecture for a test project. These test modules may then be coupled to one or more devices under test (DUT) which shall be tested. In accordance with a specific test routine, stimulus signals are supplied from the test device to the connected DUTs. Particularly, such stimulus signals may be directed to specific pins of a DUT, like for instance a memory product to be tested. In accordance with the functionality of the DUT, the stimulus signals are processed within the DUTs, and response signals are generated. These response signals are provided at the same or at other pins and may be supplied back to the test device. Within the different test modules, these response signals may be compared to expected signals, and the result of this comparison may yield the result whether a respective DUT is acceptable or has to be rejected. The result of this analysis may be sent back from the test device to the workstation in the form of a result signal. A human operator may monitor the test procedure and/or may evaluate the test results using the central control instance.

In the test device, the individual test modules are foreseen to provide different functions. The test modules may be foreseen as plug-in modules or slide-in cards, so that such cards are replaceable in a board in order to configure the test apparatus in accordance with a specific test to be carried out.

In other words, each of the test modules of such a test apparatus may format the data processed in such a test module in accordance with the individual function of the test module. For instance, a digital channel may be provided with digital input signals and may convert them into digital output signals. An analog channel may receive digital input signals and may generate an analog waveform therefrom. A power supply channel may generate one or more power supply signals, for instance a supply voltage VDD of a particular amplitude (for example 3V) to be applied to the device under test. A radio frequency test module (RF) may be adapted to generate a high frequency signal (for example some hundred MHz) to be applied to a device under test (DUT). A DC module may generate a direct current or a constant voltage to be supplied to the device under test. Other types of modules are possible.

According to an exemplary embodiment, instead of providing a set of completely individualized test modules, each module is designed to have a standard portion and an individualized portion. It is possible that these two portions are functionally separated but accommodated in the same physical housing, or provided as two separate components on a common board. It is also possible that these two portions are physically separated and accommodated in different physical housings.

By providing the standard portion in all types of test modules, even very simple modules (like a power supply module or a DC module) may then have, with very few additional costs due to the standardized configuration of this universal portion, additional components like a sequence control steering for a test procedure. This may allow to improve the functionality of such low function test modules, like power supply or DC.

During a test measurement, three test steps may be distinguished:
1. Test setup: This may include the programming of the measurement device, that is to say the programming of the channels including the universal section and the specific section.
2. Test execution: This may include the application of stimulus signals to the DUT and the sensing or detection of response signals from the DUT.
3. Evaluation of the result: This may include a comparison of the result signals to expected signals.

A further advantage of exemplary embodiments may be that (in contrast to conventional approaches in which the test setup has to be programmed completely sequentially and separately for each block or test module one after the other) it is possible to program at least a part of the information into the standardized portion for a plurality of test modules together, due to the separation between a standardized component and an individualized component. Thus, only the small additional individualized portions have to be programmed individually for each of the test modules, but a main general programming portion may be performed centrally. This may reduce programming time and therefore test time, saving costs.

Particularly, a part of the information to be programmed in the universal section may be loaded in parallel (for instance instructions, or a sequence control). However, another part of the information to be programmed into the universal sections of each of the test modules may be performed sequentially, that is to say individually for the different universal sections of different test modules (for instance to specify parameter values like voltage values individually for the different universal sections).

It is also possible to synchronize the test execution for different modules or boards to one another. This allows for a synchronous execution of actions by the individual test modules, simplifying the system. For example, a chronology of the execution of individual test sequences may be synchronized with a central programming. Therefore, according to an exemplary embodiment, a parallel programming of the standard portion of the test modules may be performed allowing a refinement of the interactions of the modules contributing to the test routine.

Furthermore, it may be possible that a conversion unit is provided for converting data traveling between the standardized portion and the individual portion, so as to bring the different data formats into accordance to one another.

Embodiments of the invention may have the advantage that a faster test is possible. Furthermore, a synchronous execution of the measurement is possible. The development efforts for developing a new test module may be reduced, since all unspecific general resources and capabilities may be bundled in a universal section which may be developed once for a plurality of different test modules.

Next, further exemplary embodiments will be explained. In the following, further exemplary embodiments of the test module will be explained. However, these embodiments also apply for the test device, for the test apparatus and for the method.

The universal section may comprise a first memory unit adapted for storing at least one test pattern for testing the device under test. Thus, such a memory unit may include information with respect to the type of test or test to be carried out. This may include information whether a digital logic test (involving only the application and reading of logic values "0" or "1") is carried out, or whether a DC test (that is to say the measurement of constant analog current values) shall be carried out. Beyond this, this may include the definition which kind of DUTs shall be tested, for example whether a memory test shall be carried out which may include read and/or write cycles in the test device using, for instance, analog waveforms. Furthermore, a test sequence may be taken into account, for instance a scheme indicating that individual memory cells, rows of memory cells, columns of memory cells, diagonals of memory cells, etc., of a memory cell array are tested by read/write cycles.

The universal section may comprise a second memory unit adapted for storing a set of expected values to be compared to response signals generated by the device under test in response to the application of stimulus signals to the device under test. Such a second memory unit may store a set of values which have to be compared to the result signals, in order to derive the result whether the deviation of the measured values from the desired or expected values is sufficiently small that the DUT can be accepted or is so large that the DUT has to be rejected.

A third memory unit of the universal section may be adapted for storing a set of result values resulting from a comparison of expected values with response signals generated by the device under test in response to the application of stimulus signals to the device under test. Such response signals may be indicative of the test result, namely whether the DUT can be accepted or not.

The first to third memory units may each be physically separate memory units or may be different partitions of one physical memory.

Apart from the memory portions, the universal section may comprise a processor unit which may access the memory portions and which may be adapted for controlling the performance of the specific test function. The processor unit may be a CPU (central processing unit) or may be any other processing resource enabling to control the execution of the test, and to perform calculation tasks.

According to an exemplary embodiment, the universal section consists of the processor unit and of the described memory unit or units and of interfaces. In other words, according to such an embodiment, no further components are provided apart from the processor unit, the memory and interfaces to connect the devices.

The test module may be adapted as a cartridge to be removably inserted into a slot of a receiving unit of a test device. The term "cartridge" may be denoted as any detachable sub-unit that is held within its own container or that is formed on a common substrate.

The universal section and the specific section may be one of the group consisting of two physically separate components being accommodated within two separate casings, one physically common component being accommodated within a common casing, and two separate software components. According to one configuration, the universal section and the specific section are two different hardware modules which may be connected, for instance by electrically connecting corresponding interfaces of these components to one another (for instance mechanically using a cable connection, or in a wireless manner). It is also possible that both the universal section and the specific section are accommodated in one and the same physical device, for example mounted on one board. The universal section and the specific section may be, partially or entirely, realized in software, so that the universal section may then be a portion of a code which is identical for all test modules, wherein the code of the specific section varies between different test modules.

The specific section may comprise a converting unit adapted for converting signals traveling between the specific section and the universal section to fit to one another. It may be advantageous, in order to make signals coming from the universal section more test specific or to make signals coming from the specific portion to become more test universal, to convert the signals between the two components as some sort of translation between the language of the two sections. Such a converting unit may be adapted for converting between universal signals and specific signals. It may comprise a programmable logic unit, like a Field-Programmable Gate Array (FPGA). An FPGA may be denoted as a specifically made digital semiconductor often used for prototyping. The conversion unit may also include a Programmable Logic Device (PLD) which may be denoted as a digital IC that can be programmed by the user to perform a wide variety of logical operations. The converting unit may further be an Application Specific Integrated Circuit (ASIC) which may be denoted as a kind of integrated circuit, often referred to as "gate array" or as "standard cell" product, developed and designed to satisfy one customer specific application requirement. More generally, the conversion unit may be any logic unit or processing unit adapted to convert between different signal formats in the universal section and in the specific section.

The test module may be adapted for testing a device under test of the group consisting of a memory device, a DRAM device, a logic device, an electrical circuit, an integrated circuit, a processor, a system-on-chip, a smartcard, a transponder, and a hybrid circuit. The test apparatus may be provided as a modified test device, like the 93000 SOC device of Agilent Technologies. With such a test device, the proper function of any device under test (DUT) may be checked so as to obtain the result whether a particular DUT has passed or failed the test. Such a DUT may be, for instance, a system-on-chip in an integrated circuit (IC), a central processing device (CPU), a storage device (for instance a DRAM memory product, or any other product).

The test module may fulfill a specific sub-function in the context of a complex test. For example, the test module may be a digital waveform generating module adapted for generating a digital waveform to be applied to a DUT. The test module may be an analog waveform generating module adapted to generate an analog waveform as test sequence to be supplied to the DUT. The test module may also be a power supply module for providing power supply signals of the DUT, for instance providing a supply potential VDD and a ground potential VSS to the DUT. The test module may be a radio frequency (RF) test signal generation module adapted for generating a test signal in the radio frequency domain. It is also possible that the test module is a direct current (DC) test signal generating module for generating a specific value of a direct current or a direct voltage to test the system.

In the following, further exemplary embodiments of the test device will be explained. However, these embodiments also apply for the test module, for the test apparatus and for the method.

The universal section of different test modules of such a test device may be identical for each of the plurality of test modules. In other words, the universal unit may be completely unspecific and may supply a common basis of electronic functions which may be needed in different modules.

Particularly, the specific section may be different for a part of or for all of the plurality of test modules. Therefore, the hardware and/or software components of the specific section is completely individualized to provide, in addition to the basic skills of the universal section, the test functionality needed.

In the following, further exemplary embodiments of the method will be explained. However, these embodiments also apply for the test module, for the test device and for the test apparatus.

The method may comprise configuring at least two of the specific sections of the plurality of test modules sequentially in accordance with the specific test for testing the device under test. Thus, in contrast to the universal sections, it is usually useful to configure the specific sections individually or groupwise so as to individualize the individual test modules in accordance with the specific sub-functions of a test. However, if possible, also the specific sections may be grouped so as to be programmed at least partially in parallel (for instance the specific sections of all DC modules may be programmed in a common programming procedure).

The configuring of the at least two of the universal sections in a simultaneous manner may comprise specifying a specific test routine. For instance, when a test has to be carried out, each universal section may be programmed with the information that the supply voltage level should be 5V.

The at least partial configuration of at least two of the universal sections of the plurality of test modules simultaneously may comprise synchronizing the performance of at least two of the plurality of test modules. When, for instance a timing, or other operation parameters of the universal sections are configured together, this may allow to synchronize the complete workflow of the test. By synchronizing the individual units, the failure safety of the system may be improved.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
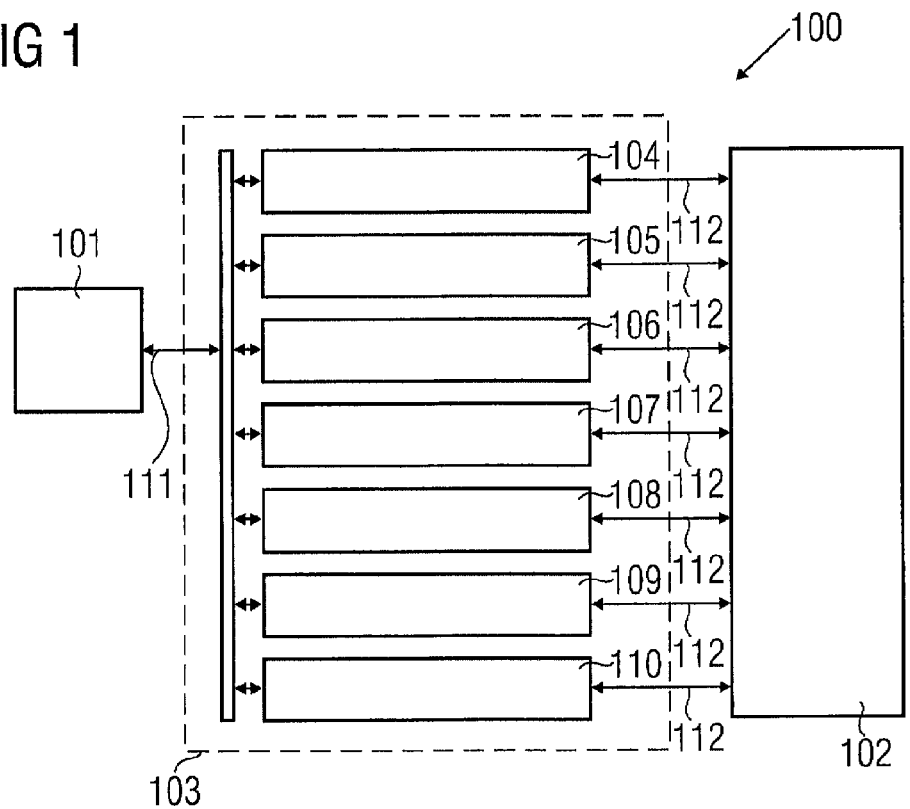
FIG. 1 shows a test apparatus.

In the following, referring to FIG. 1, a test apparatus 100 will be explained.

The test apparatus 100 comprises a workstation 101 as a central control device for the System 100. Furthermore, a device under test 102, for instance a storage product to be tested, is provided in the System 100. An actual test device 103 is connected between the workstation 101 and the device under test 102. It comprises a plurality of test modules 104 to 110. The test modules 104 to 108 are digital channel test modules adapted to generate a digital test signal to be applied to pins of the device under test 102. The test module 109 is an analog channel module adapted to apply an analog waveform to pins of the DUT 102. The test module 110 is a power supply channel adapted to generate a power supply signal for powering the DUT 102 during the test.

The measurement head 103 comprises a first interface 111 interfacing between the workstation 101 and the test device 103. A further interface 112 couples the test device 103 to the DUT 102.

Since all test modules 104 to 110, which may also be denoted as channels, have to be developed individually, the expenditures for the development are high, the development times are long, the costs for development are high, and the production costs are high due to the high number of varieties of test modules 104 to 110 needed for a test.

In the following, referring to FIG. 2, a test apparatus 200 according to an exemplary embodiment of the invention will be explained.

The test apparatus 200 may be based on a 93000 test apparatus of Agilent Technologies. The test apparatus 200 is adapted for testing a device under test 201, for instance a memory product or an electronic chip for a mobile phone.

The test apparatus 200 comprises a workstation 202 as a central control device for centrally controlling a test to be performed for testing the DUT 201.

The workstation 202 comprises a user interface allowing a user to control and monitor the execution of the test and to evaluate the result. The user interface may be or may comprise a graphical user interface (GUI). Such a graphical user interface may include a display device (like a cathode ray tube, a liquid crystal display, a plasma display device or the like) for displaying information to a human operator, like data related to the DUT, the test device or the test to be carried out. Further, a graphical user interface may comprise an input device allowing the user to input data (like data specifying the DUT or the test) or to provide the system with control commands. Such an input device may include a keypad, a joystick, a trackball, or may even be a microphone of a voice recognition system. The GUI may allow a human user to communicate in a bi-directional manner with the system.

Furthermore, a test device 203 (which may also be denoted as a test head) may be provided. The test device is coupled via a first interface 204 to the workstation 202 and is coupled via a second interface 205 to the DUT 201.

Figure 2:
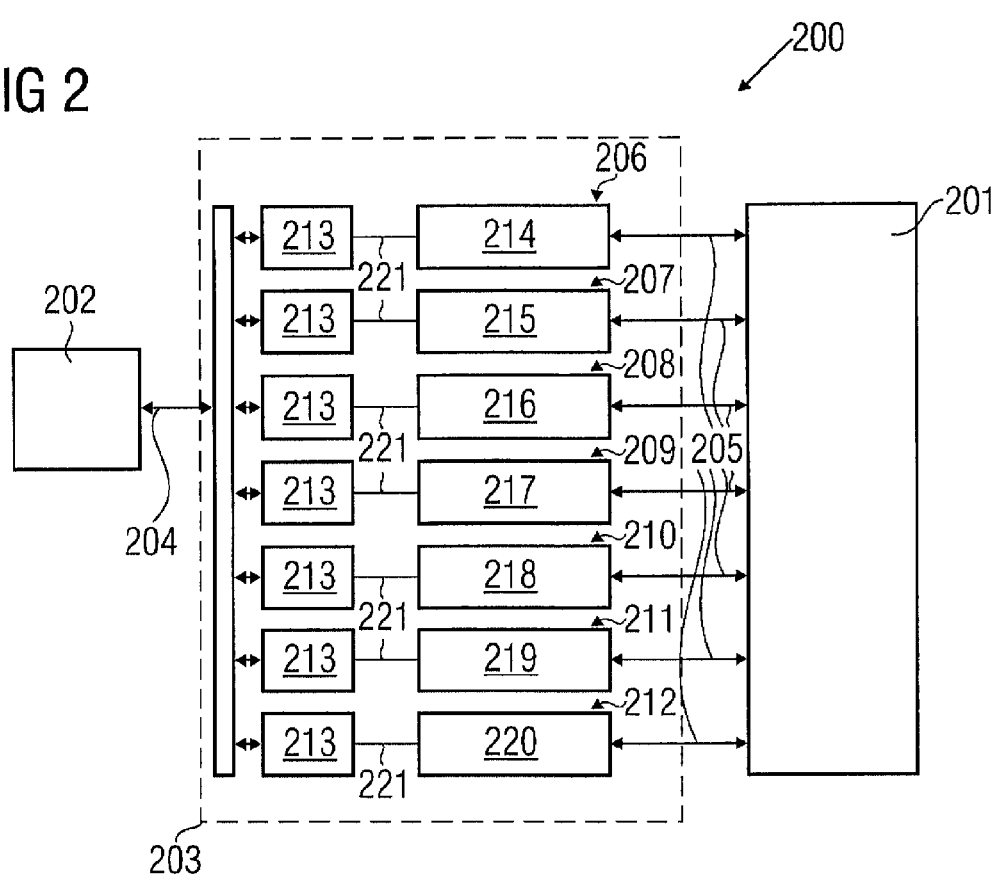
FIG. 2 shows a test apparatus according to an exemplary embodiment of the invention.

As can further be taken from FIG. 2, the test device 203 comprises a receiving unit (not shown) adapted for receiving a plurality of test modules 206 to 212. Such a receiving unit may be a rack in which a plurality of cartridges as the test modules 206 to 212 may be inserted.

Each of the test modules 206 to 212 comprises a universal section 213 and a specific section 214 to 220.

Each of the test modules 206 to 212 is adapted for being operated in connection of the test apparatus 200 for testing the DUT 201, wherein the test modules 214 to 220 each are adapted for performing a specific individual test function differing for the different test modules 206 to 212. The test modules 206 to 210 are adapted as digital driver/receiver test modules, adapted for generating a digital stimulus signal to be applied to the DUT 201 and adapted to evaluate a digital response signal of the DUT 201. Furthermore, the test module 211 is an analog driver/receiver test module adapted for generating an analog waveform and evaluating a corresponding response signal generated by the DUT 201. The test module 212 is a power supply driver/receiver module which is adapted to generate a power signal to power the DUT 201.

The universal section 213 is identical for all test modules 206 to 212 and is adapted to provide test resources being unspecific with regard to the test function of the respective test modules 206 to 212. The universal section 213 comprises a control interface 204 adapted to be connected to the central control device 202 of the test apparatus 200. In contrast to this, each of the specific sections 214 to 220 is coupled to the corresponding universal section 213 of the respective module 206 to 212 via an internal interface 221 and is adapted to provide test resources being specific with regard to the test function of the test module 206 to 212. Each specific section 214 to 220 is individualized for each of the test modules 206 to 212 and comprises a device under test interface 205 for connection to the DUT 201.

Thus, the universal channels 213 may comprise identical resources (although they may be programmed individually). In contrast to this, the hardware and software structure of each of the specific sections 214 to 220 is individualized to provide a specific functional or physical block to carry out a corresponding function.

The test modules 206 to 212 are adapted as cartridges to be removably inserted into a corresponding slot of the receiving unit of the test device 203. For configuring the test device 203 for the test apparatus 200 for testing the DUT 201, the plurality of test modules 206 to 212 may be inserted into the receiving unit of the test device 203. Then, the universal sections 213 may all be configured (partially or entirely) in a simultaneous programming step so as to program all universal sections 213 in accordance with a specific test for testing the DUT 201. In contrast to this, the specific sections 214 to 220 are each programmed individually (for example one after the other), since they include individual functionality with respect to their function within the test.

By performing such a simultaneous programming of the universal section 213, the performance of the individual test modules 206 to 212 may be synchronized, for instance to obtain a common timing allowing an accurate definition of the test chronology.

Figure 3:
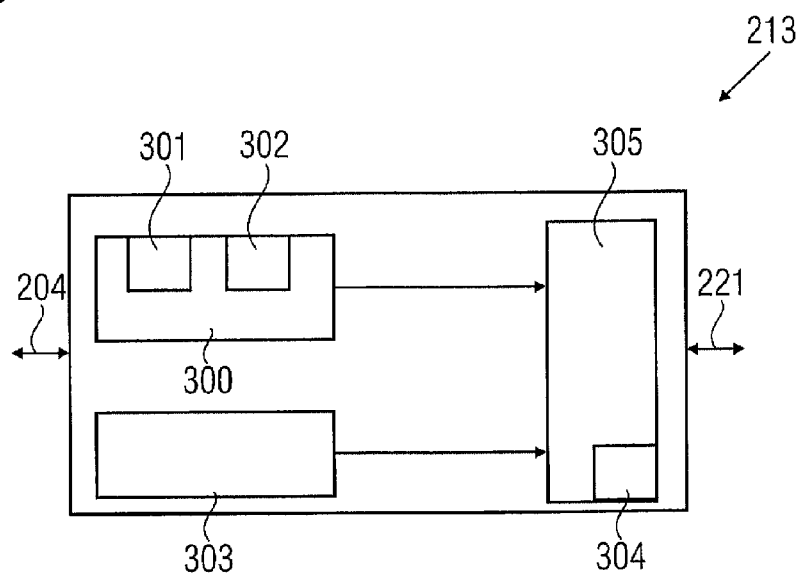
FIG. 3 shows a universal section of a test module for a test apparatus according to an exemplary embodiment.

In the following, referring to FIG. 3, the universal section 213 will be explained in more detail.

The universal section 213 comprises a first memory unit 300 adapted for storing one or a plurality of test patterns for testing the DUT 201. The first memory 300 may include a program portion 301 and a data portion 302. In the program portion 301, instructions with respect to a specific test routine may be stored (for instance "take 8 bits from a data signal and shift them 5 times forwards"). The data portion 302 may include test parameter information (for instance the information that an amplitude of a voltage may be "5V").

Beyond this, the universal section 213 comprises a second memory unit 303 adapted for storing a set of expected values to be compared to response signals generated by the DUT 201 in response to the application of stimulus signals to the DUT 201. The data transfer from and to the DUT 201 can be carried out via the interfaces 221 and 205.

Moreover, the universal section 213 comprises a third memory portion 304 adapted for storing a set of result values resulting from a comparison of expected values to a response signal generated by the DUT 201 in response to the application of stimulus signals to the DUT 201.

Moreover, the universal section 213 comprises a processor unit 305 providing computing power adapted for controlling the performance of the specific test function. Processor unit 305 controls the entire System 213. The processor unit 305 may be realized as an ASIC.

Figure 4:
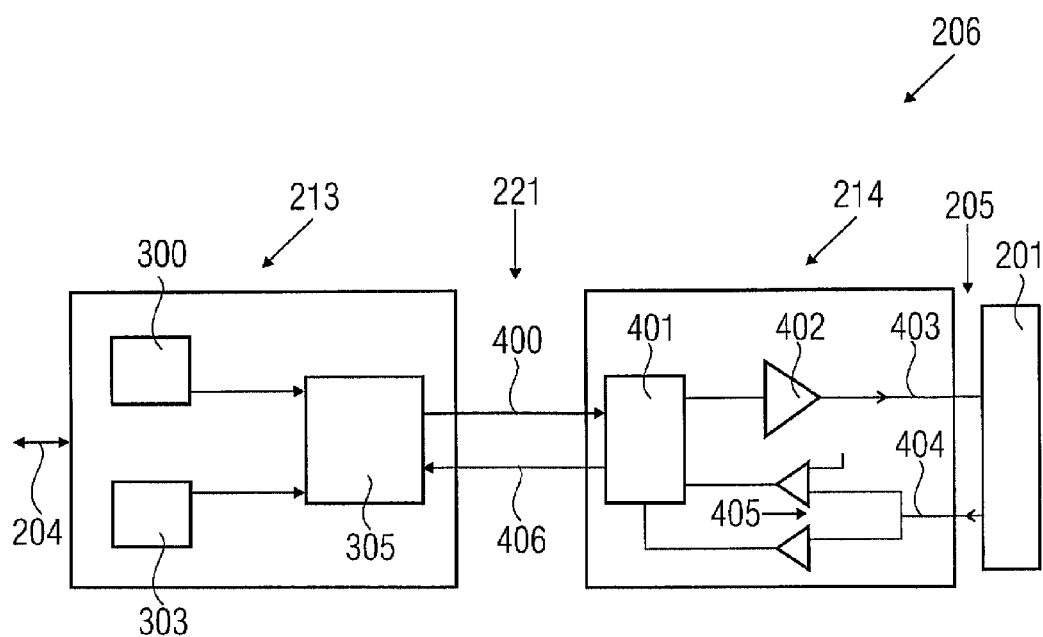
FIG. 4 shows a test module for a test apparatus according to an exemplary embodiment.

In the following, referring to FIG. 4, the cooperation between the universal portion 213 and the specific section 214 of the test module 206 will be explained in more detail.

The test module 206 is a digital channel test module.

In order to initiate a test of the DUT 201, the processing unit 305 of the universal section 213 generates signals 400 specifying a test to be carried out.

These are supplied to a conversion unit 401 of the specific section 214. Alternatively, the conversion unit 401 may be located within the universal section 213 or between the universal section 213 and the specific section 214. The conversion unit 401 is adapted for converting universal signals 400 provided by the universal section 213 and specific signals provided by the specific section 214, for instance to bring the signal formats in accordance with one another. The converting unit 401 may be a programmable logic unit, for instance an FPGA.

The converted signals are supplied to a driver 402 which generates stimulus signals 403 to be applied to specific pins of the DUT 201 via the interface 205. After the signal has passed the DUT 201, response signals 404 are supplied to a logic unit 405 and are then supplied back to the conversion unit 401. The conversion unit 401 reconverts the signals provided at outputs of the logic unit 405 into universal response signals 406 which again may be processed by the processor unit 305. Now, a comparison of expected signals can be carried out and the result may be conveyed back to the workstation 202 via the interface 204. At the workstation 202, the results may be displayed, and the workstation 202 may also provide a graphical user interface for a user to interact with the system 200.

The conversion unit 401 may harmonize/individualize signals to be exchanged between the universal part 213 and the specific part 214. Thus, a conversion logic may be provided within the device 401 which converts standardized signals into specific signals, or vice versa. In other words, a conversion to make the signals consistent with the specific application may be carried out by the conversion unit 401.

It should be noted that the term "comprising" does not exclude other elements or features and the "a" or "an" does not exclude a plurality. Also elements described in association with different embodiments may be combined. It should also be noted that reference signs in the claims shall not be construed as limiting the scope of the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A test apparatus comprising a plurality of test channels for testing a device under test, each test channel comprising a test module being adapted for performing a specific test function and each test module comprising:

a universal section providing test resources being unspecific with regard to the test function of the test module, the universal section comprising a control interface providing a connection to a central control device of the test apparatus;

a specific section coupled to the universal section and providing test resources being specific with regard to the test function of the test module, the specific section comprising a device under test interface providing a connection to the device under test.

2. The test apparatus of claim 1, wherein the universal section comprises a first memory unit providing storage for at least one test pattern for testing the device under test.

3. The test apparatus of claim 1, wherein the universal section comprises a second memory unit providing storage for a set of expected values to be compared to response signals generated by the device under test in response to the application of stimulus signals to the device under test.

4. The test apparatus of claim 1, wherein the universal section comprises a third memory unit providing storage for a set of result values resulting from a comparison of a set of expected values to response signals generated by the device under test in response to the application of stimulus signals to the device under test.

5. The test apparatus of claim 2, wherein the first memory unit, the second memory unit, and the third memory unit are logically separate memory portions being physically implemented as a single shared memory device.

6. The test apparatus of claim 1, wherein the universal section comprises a processor unit adapted for controlling the specific section.

7. A cartridge to be removably inserted into a slot of a receiving unit of a test device, the cartridge comprising the test apparatus of claim 1.

8. The test apparatus of claim 1, wherein the universal section and the specific section are one of the group consisting of two physically separate components being accommodated within two separate casings, one physically common component being accommodated within a common casing, and two separate software components.

9. The test apparatus of claim 1, wherein the specific section comprises a converting unit adapted for converting signals traveling between the specific section and the universal section.

10. The test apparatus of claim 9, wherein the converting unit is adapted for converting between universal signals and specific signals.

11. The test apparatus of claim 1, wherein the converting unit comprises a programmable logic unit.

12. The test apparatus of claim 1, wherein the converting unit comprises at least one of the group consisting of a Field-Programmable Gate Array, a Programmable Logic Device, and an Application Specific Integrated Circuit.

13. The test apparatus of claim 1, adapted for testing a device under test of the group consisting of a memory device, a DRAM memory device, a logic circuit, an electric circuit, an integrated circuit, a processor, a system-on-chip, a smartcard, a transponder, and a hybrid circuit.

14. The test apparatus of claim 1, adapted as one of the group consisting of a digital waveform generating module, an analog waveform generating module, a power supply module, a radio frequency test signal generating module, and a direct current test signal generating module.

15. The test apparatus of claim 1, comprising a receiving unit adapted for receiving a plurality of test modules.

16. The test apparatus of claim 15, wherein the universal section is identical for each of the plurality of test modules.

17. The test apparatus of claim 15, wherein the universal section is programmed or programmable identically for each of the plurality of test modules.

18. The test apparatus of claim 15, wherein the specific section is different for at least a part of the plurality of test modules.

19. The test apparatus of claim 15, wherein the specific section is programmed or programmable differently for each of the plurality of test modules.

20. The test apparatus of claim 1, the test apparatus comprising a central control device for centrally controlling a test to be performed for testing the device under test; wherein the control interfaces of the plurality of test modules to be received in the receiving unit of the test device are connected to the central control device.

* * * * *